(12) United States Patent
Sun et al.

(10) Patent No.: US 11,798,934 B2
(45) Date of Patent: Oct. 24, 2023

(54) INTEGRATED CIRCUIT INCLUDING ESD PROTECTION MODULES

(71) Applicant: Huawei Technologies Co., Ltd., Shenzhen (CN)

(72) Inventors: Hongquan Sun, Beijing (CN); Wangsheng Xie, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 188 days.

(21) Appl. No.: 17/321,063

(22) Filed: May 14, 2021

(65) Prior Publication Data
US 2021/0272948 A1 Sep. 2, 2021

Related U.S. Application Data

(63) Continuation of application No. PCT/CN2018/115665, filed on Nov. 15, 2018.

(51) Int. Cl.
| | |
|---|---|
| *H01L 27/02* | (2006.01) |
| *H01L 23/528* | (2006.01) |
| *H01L 25/065* | (2023.01) |
| *H01L 25/18* | (2023.01) |
| *H01L 27/10* | (2006.01) |

(52) U.S. Cl.
CPC ........ *H01L 27/0248* (2013.01); *H01L 23/528* (2013.01); *H01L 25/0657* (2013.01); *H01L 25/18* (2013.01); *H01L 27/10* (2013.01); *H01L 2225/06513* (2013.01); *H01L 2225/06517* (2013.01)

(58) Field of Classification Search
CPC .................. H01L 27/0248; H01L 23/528
See application file for complete search history.

(56) References Cited

U.S. PATENT DOCUMENTS

| | | | |
|---|---|---|---|
| 8,093,954 B1 * | 1/2012 | Lombaard | H01L 23/647 |
| | | | 257/536 |
| 10,522,531 B1 * | 12/2019 | Karp | H01L 23/60 |
| 2013/0063843 A1 | 3/2013 | Chen et al. | |
| 2021/0407915 A1 * | 12/2021 | Contreras | H01L 25/0652 |

FOREIGN PATENT DOCUMENTS

| | | |
|---|---|---|
| CN | 1909230 A | 2/2007 |
| CN | 107924909 A | 4/2018 |
| WO | 2017091155 A1 | 6/2017 |

OTHER PUBLICATIONS

Gao et al., "A High-Performance Slow-Wave CPW with ESD Protection for Ultraflat Band Millimeter-Wave Applications," RTU1B-3, 2017 IEEE Radio Frequency Integrated Circuits Symposium, pp. 316-319 (2017).

* cited by examiner

*Primary Examiner* — Thao P Le
(74) *Attorney, Agent, or Firm* — Leydig, Voit & Mayer, Ltd.

(57) ABSTRACT

This application discloses an integrated circuit, and relates to the field of electronic technologies, to ensure that the integrated circuit has a relatively high bandwidth and can meet an ESD standard. The integrated circuit includes a die and a transmission line coupled to the die. Electrostatic discharge ESD modules are periodically disposed on the transmission line.

17 Claims, 4 Drawing Sheets

• represents an S terminal

INTEGRATED CIRCUIT INCLUDING ESD PROTECTION MODULES

CROSS-REFERENCE TO RELATED APPLICATIONS

This application is a continuation of International Application No. PCT/CN2018/115665, filed on Nov. 15, 2018, the disclosure of which is hereby incorporated by reference in its entirety.

TECHNICAL FIELD

This application relates to the field of electronic technologies, and in particular, to an integrated circuit.

BACKGROUND

With evolution of an integrated circuit (IC) process, a size of an active component is smaller, a parasitic capacitance of the active component is smaller, and a working frequency of an IC is higher. Therefore, a high-speed input/output (IO) transmission rate and a high-speed analog-to-digital converter (ADC) bandwidth of the IC are higher. However, to ensure electrostatic discharge (ESD) performance of the IC, the IC needs to meet the following ESD standard: a human body model (HBM) is greater than 2 kV, a machine model (MM) is greater than or equal to 100 V/200 V, and a charged device model (CDM) is greater than or equal to 200 V/500 V. Therefore, a size of an ESD protection device used to ensure the ESD performance in the IC slightly changes, and a parasitic capacitance of the ESD protection device also slightly changes. As a result, a contradiction occurs between both of high-speed I/O transmission and a high-speed ADC bandwidth and the ESD standard. How to resolve the contradiction becomes a problem.

SUMMARY

Embodiments of this application provide an integrated circuit, to ensure that the integrated circuit has a relatively high bandwidth and can meet an ESD standard.

According to a first aspect, an integrated circuit is provided. The integrated circuit includes a die and a transmission line coupled to the die. Electrostatic discharge (ESD) modules are periodically disposed on the transmission line. In the foregoing technical solution, the ESD modules configured to protect the die are periodically disposed on the transmission line, so that a total impedance $Z_0$ ($Z_0$ represents a total impedance including a total inductance L of the transmission line itself and a lumped capacitance $C_{ESD}$ corresponding to the ESD modules) of the transmission line is equivalent to a characteristic impedance for the die, but is not $C_{ESD}$ in an existing bandwidth formula $\omega=1/(R0*C_{ESD})$. In addition, theoretically, there is no upper limit for a bandwidth of the transmission line. Therefore, the integrated circuit has a relatively high bandwidth without affecting an ESD standard needed by the integrated circuit.

In a possible implementation of the first aspect, the transmission line has a periodic structure, and the ESD module is disposed in each period of the transmission line. Further, segments of the transmission line in the periods have a same characteristic impedance. In the foregoing possible implementation, the ESD module is disposed in each period of the transmission line, and the segments of the transmission line in the periods have the same characteristic impedances, so that transmission characteristics of a signal in the periods of the transmission line can be the same.

In a possible implementation of the first aspect, a characteristic impedance of the transmission line is equal to a system impedance of the die. In the foregoing possible implementation, attenuation caused by the transmission line to a transmitted signal can be minimized.

In a possible implementation of the first aspect, the integrated circuit further includes an intermediate semiconductor layer. The die is disposed on the intermediate semiconductor layer, and the transmission line is disposed in the intermediate semiconductor layer. In the foregoing possible implementation, because manufacturing costs of the intermediate semiconductor layer generally are less than manufacturing costs of the die, disposing the transmission line in the intermediate semiconductor layer can reduce production costs of the integrated circuit.

In a possible implementation of the first aspect, a feature size of the intermediate semiconductor layer is greater than a feature size of the die. In the foregoing possible implementation, the intermediate semiconductor layer has a relatively large feature size, and generally can be implemented by using a relatively simple semiconductor process. Therefore, the transmission line may be disposed in the intermediate semiconductor layer by using a relatively simple semiconductor process, to reduce the production costs of the integrated circuit.

In a possible implementation of the first aspect, the transmission line of the periodic structure includes at least two periodic structures.

In a possible implementation of the first aspect, the ESD module includes an ESD component disposed in a pull-up manner and/or an ESD component disposed in a pull-down manner. In the foregoing possible implementation, several manners of disposing the ESD component included in the ESD module are provided, and a protection function of the ESD module for the die can be implemented in the different disposing manners, to improve design flexibility of the integrated circuit.

In a possible implementation of the first aspect, the ESD component is any one of the following: a diode, a PNP transistor, an NPN transistor, a GGPMOS transistor, a GGNMOS transistor, or a silicon controlled rectifier SCR. In the foregoing implementation, a plurality of simple and effective ESD components are provided, to improve the diversity during implementation of the ESD module in the integrated circuit.

According to a second aspect, an integrated circuit is provided. The integrated circuit includes a die, an intermediate semiconductor layer, and a packaging substrate. The die is disposed on the intermediate semiconductor layer, and the intermediate semiconductor layer is disposed on the packaging substrate. Electrostatic discharge (ESD) modules are disposed on the intermediate semiconductor layer, and the ESD modules are configured to protect the die. In the integrated circuit in the second aspect of this application, because the intermediate semiconductor layer is used, the ESD modules may be formed in the intermediate semiconductor layer. Because an area of the ESD modules generally is relatively large, compared with a case in which the ESD modules are disposed in the die, disposing the ESD modules in the intermediate semiconductor layer can reduce an area of the die. In addition, production costs of the intermediate semiconductor layer are less than production costs of the die, so that disposing the ESD modules in the intermediate semiconductor layer can reduce production costs to some extent. In the intermediate semiconductor layer, the ESD modules may be evenly disposed on a transmission line to form a periodic structure, or may be disposed only at an appropriate place according to a requirement (for example, space or an interface location).

In a possible implementation of the second aspect, there are one or more dies, and the ESD modules are periodically disposed on the transmission line.

In a possible implementation of the second aspect, a feature size of the intermediate semiconductor layer is greater than a feature size of the die.

In a possible implementation of the second aspect, the ESD module includes an ESD component disposed in a pull-up manner and/or an ESD component disposed in a pull-down manner.

In a possible implementation of the second aspect, the ESD module includes any one of the following components: a diode, a PNP transistor, an NPN transistor, a GGPMOS transistor, a GGNMOS transistor, or a silicon controlled rectifier SCR.

It may be understood that a design idea, a basic principle, and the like of the integrated circuit provided in the second aspect are basically similar to those in the first aspect. Therefore, for beneficial effects that can be achieved by the integrated circuit, refer to the beneficial effects described in the first aspect provided above. Details are not described herein again.

DESCRIPTION OF EMBODIMENTS

The following describes the technical solutions in the embodiments of this application with reference to the accompanying drawings in the embodiments of this application. In this application, "at least one" refers to one or more, and "a plurality of" refers to two or more. The term "and/or" describes an association relationship for describing associated objects and represents that three relationships may exist. For example, A and/or B may represent the following three cases: Only A exists, both A and B exist, and only B exists, where A and B may be singular or plural. The character "/" generally indicates an "or" relationship between the associated objects. "At least one of the following" or a similar expression means any combination of these items, including a single item or any combination of a plurality of items. For example, at least one of a, b, or c may represent a, b, c, a-b, a-c, b-c, or a-b-c, where each of a, b, and c may be in a singular form or a plural form.

It should be noted that, in this application, the word "example" or "for example" is used to represent giving an example, an illustration, or a description. Any embodiment or design scheme described as an "example" or "for example" in this application should not be explained as being more preferred or more advantageous than another embodiment or design scheme. Exactly, use of the word "example" or "for example" or the like is intended to present a relative concept in a specific manner.

Figure 1:
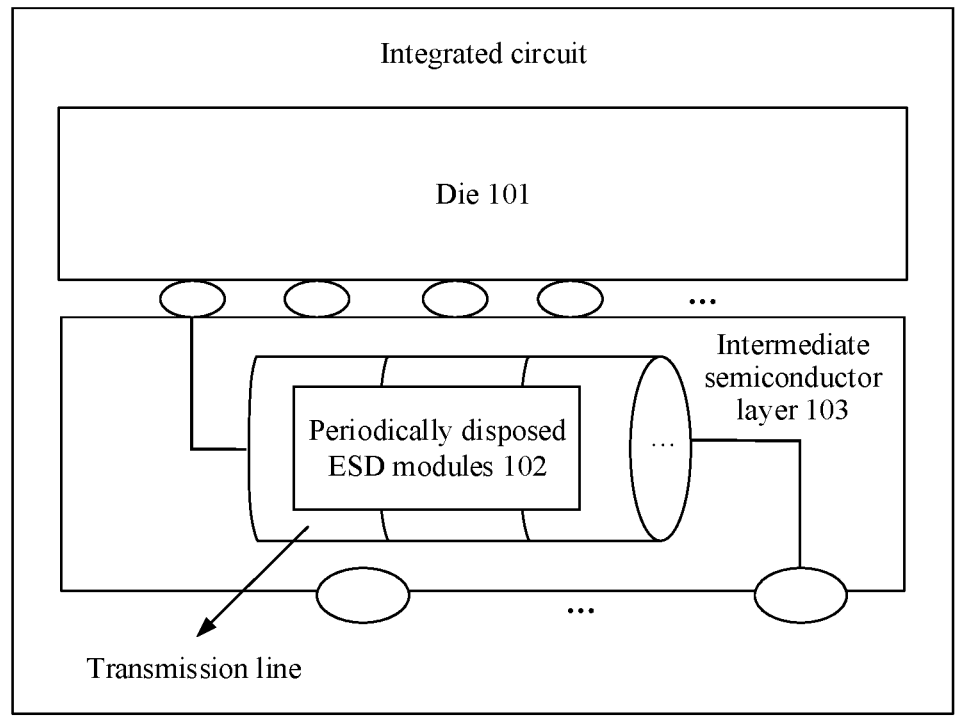
FIG. 1 is a schematic structural diagram of an integrated circuit according to an embodiment of this application.

FIG. 1 is a schematic structural diagram of an integrated circuit according to an embodiment of this application. Referring to FIG. 1, the integrated circuit includes a die 101 and a transmission line coupled to the die 101. Electrostatic discharge (ESD) modules 102 are periodically disposed on the transmission line, so that the transmission line is a transmission line of a periodic structure.

Figure 2:
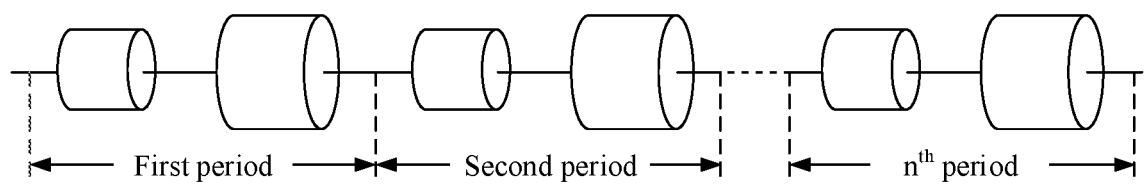
FIG. 2 is a schematic structural diagram of a transmission line according to an embodiment of this application.

In this embodiment of this application, the transmission line of the periodic structure may mean that the transmission line includes a plurality of repeated structures, and each repeated structure is referred to as one period. Herein, the repeated structure may mean that impedance types included in the structures are the same, and a plurality of impedances in the different periods are connected in a same manner (for example, each repeated structure includes an inductor and a capacitor, and the capacitor and the inductor are connected in series). Segments of the transmission line in the periods may correspond to a same impedance (namely, a total impedance including an inductance and a capacitance in each period), and the plurality may be at least two. FIG. 2 is a schematic diagram of a transmission line of a periodic structure. The transmission line is described by using an example in which two cylinders of different sizes (the cylinders of different sizes herein may represent different characteristic impedances, for example, a large cylinder represents an inductor corresponding to the transmission line itself in one period, and a small cylinder represents a capacitor corresponding to the ESD module 102 in one period) form one period. In FIG. 2, n represents a quantity of periods included in the transmission line, and n is a positive integer greater than or equal to 2. For example, n may be equal to 10, 20, or the like. The transmission line of the periodic structure technologically has a prominent feature: a transmission speed of an electromagnetic wave in the transmission line is relatively slow, and therefore, the transmission line may also be referred to as a slow-wave transmission line.

In an optional embodiment, the transmission line itself is considered as a stable and even structure without considering another electronic device externally connected to the transmission line. In this case, the transmission line is intercepted based on a specific length and the ESD modules are disposed to form the transmission line of the periodic structure. The transmission line itself is equivalent to providing an inductance, and the ESD module provides a capacitance. Therefore, in this embodiment of this application, the transmission line of the periodic structure may be: The transmission line is divided into the plurality of periods based on the specific length, the segments of the transmission line in the periods have a same length, and one ESD module is disposed on the transmission line in each period. It is not emphasized herein that a same ESD module is used in each period. Because a structure of the ESD module generally is simple, for example, a diode that is connected to a power terminal or that is grounded, and the ESD module can provide a relatively stable capacitance, individual differences of the ESD modules generally can be ignored. If a fine structure is needed, ESD modules with an equal capacitance value or similar capacitance values may be selected and disposed in the periods.

Certainly, in actual use, the transmission line may be set by using different processes, or the transmission line may be connected to another electronic device. As a result, even if the transmission line is equally divided into the periods, the segments of the transmission line do not have a same inductance or capacitance. There are two processing methods to resolve this problem.

In a first processing method, a difference caused by a process difference of the transmission line is small, and an inductance or a capacitance provided by an electronic device is controllable. Therefore, as long as it is in an acceptable range, different periods of the structure are still divided in such a manner that the transmission line is equally divided and the ESD modules are configured. In other words, the transmission line of the periodic structure is still as follows: The transmission line is divided into the plurality of periods based on the specific length, the segments of the transmission line in the periods have a same length, and a similar ESD module is disposed on the transmission line in each period. The disposed ESD modules may have an identical circuit structure, or may have different circuit structures but have similar capacitances or inductances.

In a second resolution method, a length of the transmission line and the ESD modules are designed in consideration of an inductance and a capacitance that can be provided by an external electronic device, to enable inductances and capacitances in the periods of the transmission line of the periodic structure to be approximately equal. This method is applicable to a scenario in which transmission line generation processes greatly differ from each other, or another electronic device having a high inductance or capacitance needs to be externally connected.

In addition, that the ESD modules 102 are periodically disposed on the transmission line may mean that an ESD module having a same impedance is disposed in each period of the transmission line of the periodic structure. The ESD module 102 may be configured to represent an ESD component used for electrostatic discharge protection, and the integrated circuit may include a plurality of ESD modules 102. The plurality of ESD modules 102 correspond to one lumped capacitance $C_{ESD}$. Generally, a product of $C_{ESD}$ and a system impedance $R_0$ of the die 101 determines an upper limit of an input/output (Input Output, IO) bandwidth of the integrated circuit: $\omega=1/(R0*C_{ESD})$. $R_0$ generally is 50 SI Because theoretically, there is no upper limit for a bandwidth of the transmission line, to reduce or avoid an impact caused by $C_{ESD}$ on the bandwidth, the ESD modules 102 may be periodically disposed on the transmission line, so that a total impedance $Z_0$ ($Z_0$ represents a total impedance including a total inductance L of the transmission line itself and the lumped capacitance $C_{ESD}$ corresponding to the plurality of ESD modules 102) of the transmission line of the periodic structure matches the system impedance $R_0$, for example, is equal to 50Ω. In this way, attenuation caused by the transmission line to a transmitted signal can be minimized. In addition, for the integrated circuit, the transmission line on which the ESD modules 102 are disposed is equivalent to a characteristic impedance (the characteristic impedance means that an impedance of the entire transmission line remains constant), an impedance characteristic represented, for the die 101, by the total impedance $Z_0$ that includes $C_{ESD}$ of the ESD modules and the total inductance L of the transmission line itself is a resistor rather than a separate capacitor, and the total impedance $Z_0$ is no longer $C_{ESD}$ in the existing bandwidth formula $\omega=1/(R0*C_{ESD})$, so that the bandwidth of the integrated circuit is no longer limited by $C_{ESD}$, and therefore, has a relatively high bandwidth upper limit, and an ESD standard needed by the integrated circuit can be met. For example, in FIG. 2, the plurality of ESD modules 102 are periodically disposed on the transmission line, and the ESD module 102 is disposed in each period of the transmission line. In FIG. 2, the ESD module 102 is represented by using ESD.

The ESD modules 102 disposed on the transmission line can prevent external energy from attacking the die 101 along the transmission line. In addition, the ESD modules 102 disposed on the transmission line and a circuit in the die 101 have ground terminals or power terminals. Therefore, the circuit in the die 101 is connected to the ESD modules 102 by using a grounding path or a voltage connection path. Therefore, charges generated in the die 101 can be released by using the ESD modules 102 on the transmission line.

Optionally, as shown in FIG. 1, the integrated circuit further includes an intermediate semiconductor layer (also referred to as an interposer in the industry) 103, and the transmission line is disposed in the intermediate semiconductor layer 103. Because an area of the transmission line on which the ESD modules 102 are periodically disposed is very large, compared with a case in which the transmission line is disposed in the die 101 having relatively high costs, disposing the transmission line in the intermediate semiconductor layer 103 having relatively low costs can reduce an area of the die 101 and reduce the costs to some extent.

The intermediate semiconductor layer 103 is located on an interface between the die and a substrate, and is mainly made of a semiconductor material. Currently, common semiconductor materials include silicon, germanium, gallium arsenide, and the like. Currently, silicon is most common in chips in the consumer field. A semiconductor device such as a transistor may be generated on the intermediate semiconductor layer by using a processing method. Compared with the die 101 carried on the intermediate semiconductor layer, the intermediate semiconductor layer may use relatively low-end semiconductor process precision. Compared with a case in which the ESD modules are disposed in the die 101, disposing the ESD modules on the intermediate semiconductor layer 103 have features of a simple front-end process and low costs. For example, the intermediate semiconductor layer 103 may include a body formed by using a silicon wafer as a main material, and then, an active region and a metal layer of the intermediate semiconductor layer are formed by using a semiconductor manufacturing process, and different layers are conducted by using a through-silicon via (TSV) technology. A quantity of the metal layers may range from one to more than a dozen, and may be specifically set according to an actual situation. For a plurality of metal layers, a metal layer close to the substrate of the integrated circuit may be referred to as a low metal layer, a metal layer away from the substrate may be referred to as a high metal layer, and a metal layer located between the low metal layer and the high metal layer may be referred to as a middle metal layer. For example, there are nine metal layers, and the nine metal layers may be M1 to M9 from bottom to top. In this case, high metal layers may be M8 and M9, middle metal layers may be M4 to M7, and low metal layers may be M1 to M3.

Optionally, a feature size of the intermediate semiconductor layer 103 generally is greater than a feature size of the die 101, to reduce process costs. For example, the feature size of the intermediate semiconductor layer 103 may be 90 nm, 65 nm, 45 nm, 28 nm, or the like. The feature size herein may also be referred to as a conductor width, and is a minimum conductor width that can be achieved by a preceding process of the integrated circuit.

Figure 3:
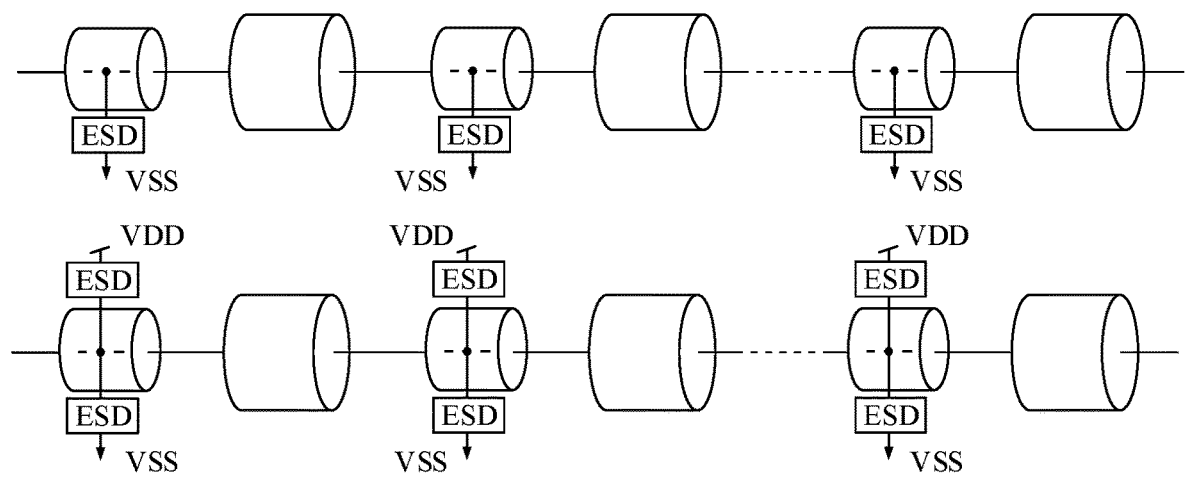
FIG. 3 is a first schematic structural diagram of a transmission line on which ESD modules are disposed according to an embodiment of this application.

In this embodiment of this application, the ESD module 102 includes an ESD component disposed in a pull-up manner and/or an ESD component disposed in a pull-down manner. The ESD component disposed in the pull-up manner means that the ESD component is connected to a power terminal, and the ESD component disposed in the pull-down manner means that the ESD component is connected to a ground terminal. As shown in FIG. 3, description is provided by using an example in which the ESD module 102 includes an ESD component disposed in the pull-down manner and an example in which the ESD module 102 includes an ESD component disposed in the pull-up manner and an ESD component disposed in the pull-down manner. ESD in FIG. 3 represents an ESD component, VSS in FIG. 3 represents a ground terminal, and VDD represents a power terminal.

Optionally, the ESD component may be any one of the following: a diode, a PNP transistor, an NPN transistor, a grounded-gate P-channel metal oxide semiconductor (GGPMOS) transistor, a grounded-gate N-channel metal oxide semiconductor (GGNMOS) transistor, or an SCR (silicon controlled rectifier). Any one of the foregoing components may be periodically disposed on the transmission line in the pull-up manner, or may be periodically disposed on the transmission line in the pull-down manner, or the components may be periodically disposed on the transmission line in both the pull-up manner and the pull-down manner.

Figure 4:
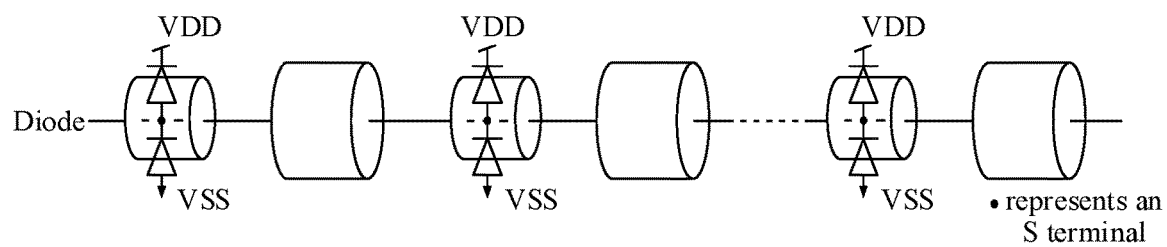
FIG. 4 is a second schematic structural diagram of a transmission line on which ESD modules are disposed according to an embodiment of this application.
Figure 5:
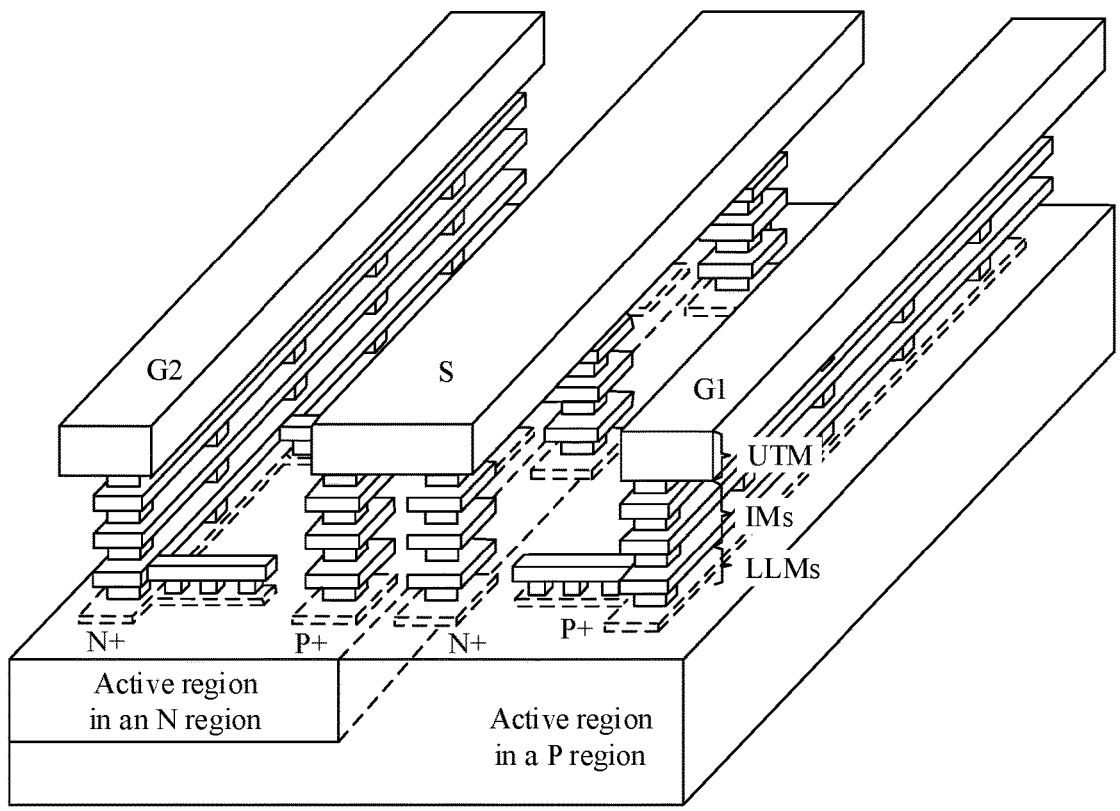
FIG. 5 is a schematic structural diagram of a diode according to an embodiment of this application.

For example, FIG. 4 is a schematic structural diagram showing that the ESD module 102 includes a diode, and the diodes are periodically disposed on the transmission line in both the pull-up manner and the pull-down manner. A working principle of electrostatic discharge performed by the disposed ESD module 102 in FIG. 4 is as follows: When a positive ESD energy pulse occurs at an S terminal, the diode disposed in the pull-up manner is in positive conduction, and ESD energy is discharged from the S terminal to the diode disposed in the pull-up manner and then to a VDD terminal. When a negative ESD energy pulse occurs at the S terminal, the diode disposed in the pull-down manner is in positive conduction, and ESD energy is discharged from a VSS terminal to the diode disposed in the pull-down end and then to the S terminal. Correspondingly, FIG. 5 is a schematic structural diagram showing that the diodes are on the transmission line. In FIG. 5, description is provided by using an example in which the diode includes an active region in an N region and an active region in a P region, and the active region in the N region and the active region in the P region are communicated by using a plurality of metal layers. The plurality of metal layers may include a top-layer thick metal (ultra thick metal, UTM), an intermediate metal (intermediate metals, IMs), and a lower level metal (lower level metals, LLMs). In FIG. 5, S represents a signal, G1 represents a ground terminal, and G2 represents a power terminal (each of G1 and G2 in a case of a radio frequency may be referred to as an alternating current ground).

Figure 6:
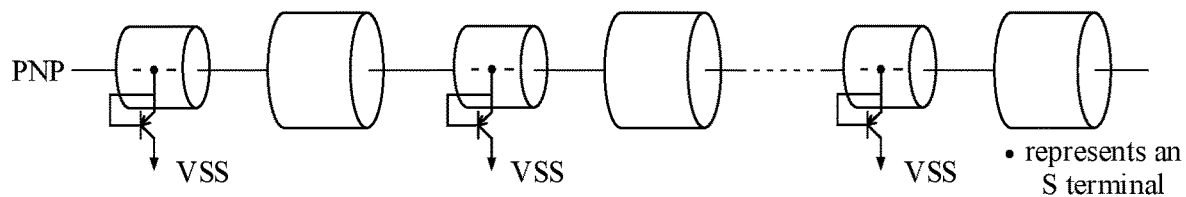
FIG. 6 is a third schematic structural diagram of a transmission line on which ESD modules are disposed according to an embodiment of this application.

FIG. 6 is a schematic structural diagram showing that the ESD module 102 includes a PNP transistor, and the PNP transistors are periodically disposed on the transmission line in the pull-down manner. A working principle of electrostatic discharge performed by the disposed ESD module 102 in FIG. 6 is as follows: When a negative ESD energy pulse occurs at an S terminal, a diode between a collector (C) and a base (B) of the PNP transistor is in positive conduction, and ESD energy is discharged from a VSS terminal to the diode between the C and the B and then to the S terminal. When a positive ESD energy pulse occurs at the S terminal, a backward diode formed by the base B and the collector C of the PNP is reversely broken down, and a resistance of a reverse breakdown current on the base B forms a voltage drop. When the voltage drop enables an emitter (E) and the base B of the PNP transistor to be in positive conduction through a PN junction, the PNP transistor is conducted, and positive pulse energy of the ESD is discharged from the S terminal to the PNP transistor and then to the VSS terminal.

Figure 7:
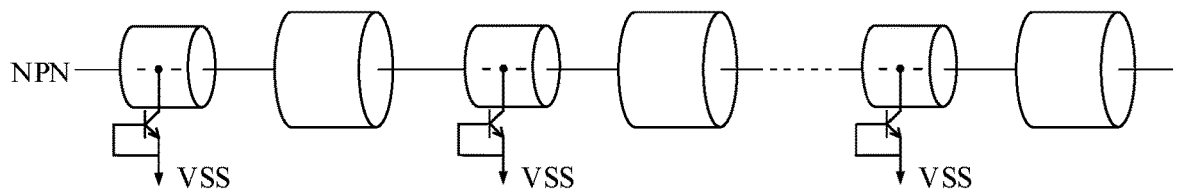
FIG. 7 is a fourth schematic structural diagram of a transmission line on which ESD modules are disposed according to an embodiment of this application.
Figure 8:
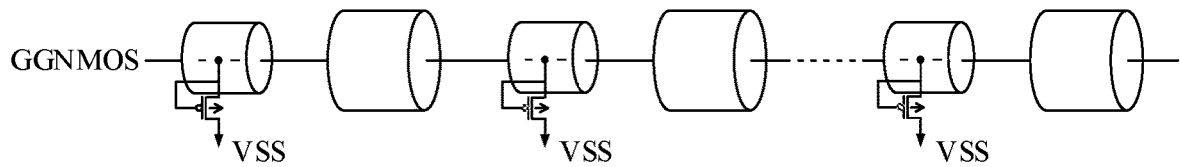
FIG. 8 is a fifth schematic structural diagram of a transmission line on which ESD modules are disposed according to an embodiment of this application.
Figure 9:
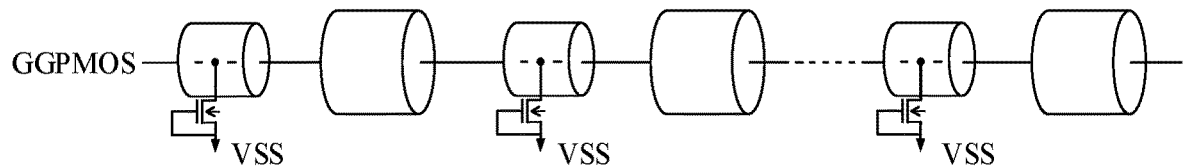
FIG. 9 is a sixth schematic structural diagram of a transmission line on which ESD modules are disposed according to an embodiment of this application.
Figure 10:
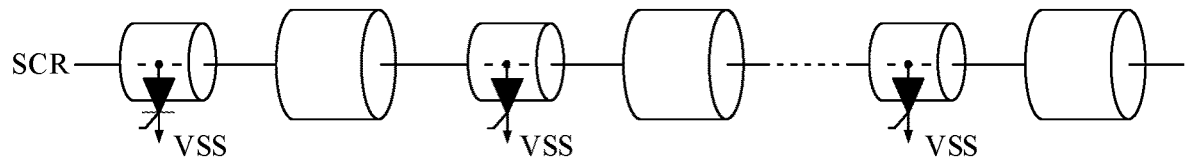
FIG. 10 is a seventh schematic structural diagram of a transmission line on which ESD modules are disposed according to an embodiment of this application.

FIG. 7 is a schematic structural diagram showing that the ESD module 102 includes an NPN transistor, and the NPN transistors are periodically disposed on the transmission line in the pull-down manner. FIG. 8 is a schematic structural diagram showing that the ESD module 102 includes a GGPMOS transistor, and the GGPMOS transistors are periodically disposed on the transmission line in the pull-down manner. FIG. 9 is a schematic structural diagram showing that the ESD module 102 includes a GGNMOS transistor, and the GGNMOS transistors are periodically disposed on the transmission line in the pull-down manner. FIG. 10 is a schematic structural diagram showing that the ESD module 102 includes an SCR, and the SCRs are periodically disposed on the transmission line in the pull-down manner.

It should be noted that description is provided above merely by using an example in which the ESD modules 102 are periodically disposed on the transmission line in FIG. 4 to FIG. 10, and this does not constitute a limitation on the embodiments of this application. In FIG. 4 to FIG. 10, VSS represents a ground terminal, and VDD represents a power terminal.

Figure 11:
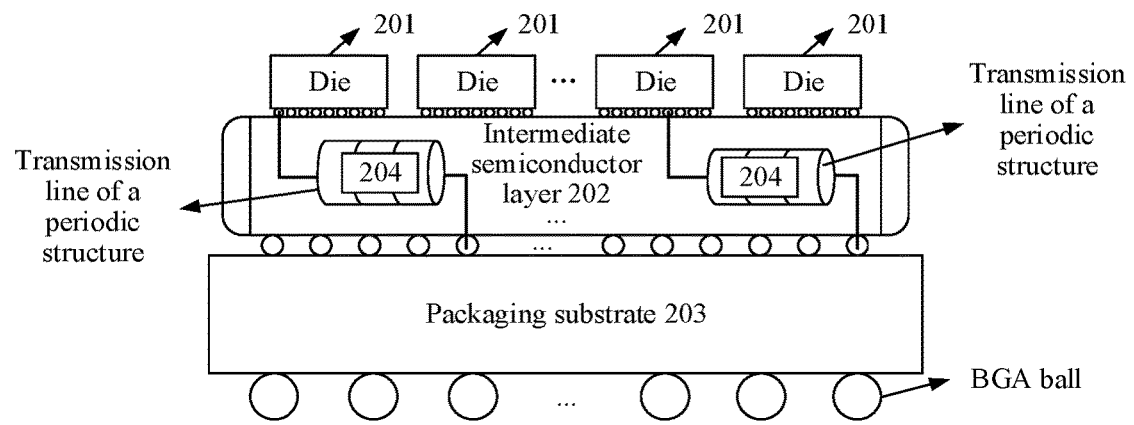
FIG. 11 is a schematic structural diagram of another integrated circuit according to an embodiment of this application.

FIG. 11 is a schematic structural diagram of an integrated circuit according to an embodiment of this application. Referring to FIG. 11, the integrated circuit includes a plurality of dies (die) 201, an intermediate semiconductor layer (interposer) 202, and a packaging substrate 203. The plurality of dies 201 are disposed on the intermediate semiconductor layer 202, and the intermediate semiconductor layer 202 is disposed on the packaging substrate 203. Electrostatic discharge ESD modules 204 are disposed on the intermediate semiconductor layer 202. Optionally, the ESD modules 204 are periodically disposed on a transmission line, and the ESD modules 204 are configured to protect the plurality of dies 201. A BGA (Ball Grid Array) ball in FIG. 11 may be a ball of a ball grid array structure.

It should be noted that the intermediate semiconductor layer 202, the ESD modules 204, and the transmission line on which the ESD modules 204 are periodically disposed in FIG. 11 are respectively similar to the intermediate semiconductor layer 103, the ESD modules 102, and the transmission line in the foregoing embodiment. For specific descriptions, refer to related content in the foregoing embodiment. Details are not described in this embodiment of this application.

In this embodiment of this application, the ESD modules 204 configured to protect the plurality of dies 201 are periodically disposed on the transmission line. Because theoretically, there is no upper limit for a bandwidth of the transmission line, setting an impedance of the transmission line to match a system impedance of the plurality of dies can ensure that the integrated circuit has a relatively high bandwidth and can meet an ESD standard needed by the integrated circuit. In addition, compared with a case in which the transmission line on which the ESD modules 204 are disposed is disposed in the plurality of dies 201, deploying the transmission line, on which the ESD modules 204 are disposed, in the intermediate semiconductor layer 202 can reduce an area of the plurality of dies 201 and reduce costs to some extent. From a perspective of reducing the area and the costs of the dies, moving the ESD modules from the dies to the intermediate semiconductor layer can reduce the area and the costs of the dies. Therefore, an integrated circuit may be further provided. The integrated circuit includes a die, an intermediate semiconductor layer (interposer), and a packaging substrate. The die is disposed on the intermediate semiconductor layer, and the intermediate semiconductor layer is disposed on the packaging substrate. Electrostatic discharge ESD modules are disposed on the intermediate semiconductor layer, and the ESD modules are configured to protect the die.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An integrated circuit, comprising a die and a transmission line coupled to the die, and a plurality of electrostatic discharge (ESD) modules periodically disposed on the transmission line, wherein the transmission line has a periodic structure, and one of the plurality of ESD modules is disposed in each period of the transmission line.

2. The integrated circuit according to claim 1, wherein segments of the transmission line in the periods have a same length.

3. The integrated circuit according to claim 1, wherein segments of the transmission line in the periods have a same characteristic impedance.

4. The integrated circuit according to claim 1, wherein each of the plurality of ESD modules comprises an ESD component disposed in a pull-up manner and/or an ESD component disposed in a pull-down manner.

5. The integrated circuit according to claim 4, wherein the ESD component is any one of the following: a diode, a PNP transistor, an NPN transistor, a grounded-gate P-channel metal oxide semiconductor (GGPMOS) transistor, a grounded-gate N-channel metal oxide semiconductor (GGNMOS) transistor, or a silicon controlled rectifier (SCR).

6. An integrated circuit, comprising a die and a transmission line coupled to the die, and a plurality of electrostatic discharge (ESD) modules periodically disposed on the transmission line, wherein a characteristic impedance of the transmission line is equal to a system impedance of the die.

7. The integrated circuit according to claim 6, wherein the transmission line has a periodic structure, and one of the plurality of ESD modules is disposed in each period of the transmission line.

8. An integrated circuit, comprising a die and a transmission line coupled to the die, a plurality of electrostatic discharge (ESD) modules periodically disposed on the transmission line, and an intermediate semiconductor layer, wherein the die is disposed on the intermediate semiconductor layer, and the transmission line is disposed in the intermediate semiconductor layer.

9. The integrated circuit according to claim 8, wherein a feature size of the intermediate semiconductor layer is greater than a feature size of the die.

10. An integrated circuit, comprising:
a die,
an intermediate semiconductor layer,
a transmission line disposed in the intermediate semiconductor layer,
a packaging substrate, wherein the die is disposed on the intermediate semiconductor layer, and the intermediate semiconductor layer is disposed on the packaging substrate; and
a plurality of electrostatic discharge (ESD) modules periodically disposed on the transmission line, wherein the plurality of ESD modules are configured to protect the die.

11. The integrated circuit according to claim 10, wherein a feature size of the intermediate semiconductor layer is greater than a feature size of the die.

12. The integrated circuit according to claim 10, wherein each of the plurality of ESD modules comprises an ESD component disposed in a pull-up manner and/or an ESD component disposed in a pull-down manner.

13. The integrated circuit according to claim 10, wherein the ESD module comprises any one of the following components: a diode, a PNP transistor, an NPN transistor, a grounded-gate P-channel metal oxide semiconductor (GGPMOS) transistor, a grounded-gate N-channel metal oxide semiconductor (GGNMOS) transistor, or a silicon controlled rectifier (SCR).

14. The integrated circuit according to claim 10, wherein the transmission line has a periodic structure, and one of the plurality of ESD modules is disposed in each period of the transmission line.

15. The integrated circuit according to claim 14, wherein segments of the transmission line in the periods have a same length.

16. The integrated circuit according to claim 14, wherein segments of the transmission line in the periods have a same characteristic impedance.

17. The integrated circuit according to claim 10, wherein a characteristic impedance of the transmission line is equal to a system impedance of the die.

* * * * *